US012793745B2

(12) United States Patent
Yu et al.

(10) Patent No.: US 12,793,745 B2
(45) Date of Patent: Nov. 10, 2026

(54) SEMICONDUCTOR DEVICE INCLUDING EMBEDDED MEMORY DIES AND METHOD OF MAKING SAME

(71) Applicant: Sandisk Technologies, Inc., Milpitas, CA (US)

(72) Inventors: Lee Kong Yu, Penang (MY); Yoong Tatt Chin, Penang (MY); Kim Lee Bock, Penang (MY); Paramjeet Gill, Kuala Lumpur (MY); Wei Chiat Teng, Penang (MY); Chong Un Tan, Shanhai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 611 days.

(21) Appl. No.: 17/746,104

(22) Filed: May 17, 2022

(65) Prior Publication Data

US 2023/0411340 A1 Dec. 21, 2023

(51) Int. Cl.
*G11C 5/06* (2006.01)
*G11C 5/04* (2006.01)
*H10W 72/50* (2026.01)

(52) U.S. Cl.
CPC ................ *G11C 5/063* (2013.01); *G11C 5/04* (2013.01); *H10W 72/50* (2026.01)

(58) Field of Classification Search
CPC ................ H01L 24/46; H01L 2224/46; H01L 2924/1434; G11C 5/04; G11C 5/063
See application file for complete search history.

(56) References Cited

U.S. PATENT DOCUMENTS 12,100,719 B2 * 9/2024 Punzalan .............. H10F 39/804
2006/0273816 A1 * 12/2006 Hsu ...................... H05K 3/4602 174/255
2012/0056312 A1 * 3/2012 Pagaila ................. H10W 20/20 257/E23.116
2021/0166991 A1 * 6/2021 Liu .................... G02B 6/12002
2022/0084977 A1 * 3/2022 Fay ......................... H01L 24/48

OTHER PUBLICATIONS ip.com search histroy (Year: 2026).*

* cited by examiner

*Primary Examiner* — Zandra V Smith
*Assistant Examiner* — Andre C Stevenson
(74) *Attorney, Agent, or Firm* — Pearl Cohen LLP

(57) ABSTRACT

A semiconductor device includes a signal carrier medium such as a PCB substrate having first and second opposed surfaces and a cavity formed in the second surface. A first set of one or more semiconductor dies are mounted on the first surface, and a second set of one or more semiconductor dies are mounted within the cavity. The first and/or second sets of semiconductor dies may be memory dies.

19 Claims, 12 Drawing Sheets

*(Step 200)*

SEMICONDUCTOR DEVICE INCLUDING EMBEDDED MEMORY DIES AND METHOD OF MAKING SAME

BACKGROUND

The strong growth in demand for portable consumer electronics is driving the need for high-capacity storage devices. Non-volatile semiconductor memory devices, such as flash memory storage cards, are now widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and solid-state drives (SSDs).

While many varied packaging configurations are known, flash memory storage cards may be assembled as system-in-a-package (SiP) or multichip modules (MCM), where a plurality of dies are mounted and interconnected on a small footprint substrate. The substrate may include a rigid, dielectric base having a conductive layer etched on one or both sides. Electrical connections are formed between the dies and the conductive layer(s), and the conductive layer(s) provide an electric lead structure for connection of the dies to a host device. Once electrical connections between the dies and substrate are made, the assembly is then typically encased in a molding compound which provides a protective package.

In order to most increase memory capacity yet stay within the package footprint, it is known to stack semiconductor dies on top of each other on a surface of the substrate, with an offset and/or overlapping each other while separated by a spacer or wire embedded film. However, there still is a need to increase storage capacity without increasing the overall size of a memory device.

DETAILED DESCRIPTION

The present technology will now be described with reference to the figures which in embodiments relate to a semiconductor device including memory dies mounted on a top surface of the substrate and within a cavity formed in the substrate. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms “top” and “bottom,” “upper” and “lower” and “vertical” and “horizontal,” and forms thereof, as may be used herein are by way of example and illustrative purposes only, and are not meant to limit the description of the technology inasmuch as the referenced item can be exchanged in position and orientation. Also, as used herein, the terms “substantially” and/or “about” mean that the specified dimension or parameter may be varied within an acceptable manufacturing tolerance for a given application. In one embodiment, the acceptable manufacturing tolerance is ±0.15 mm, or alternatively, ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 1:
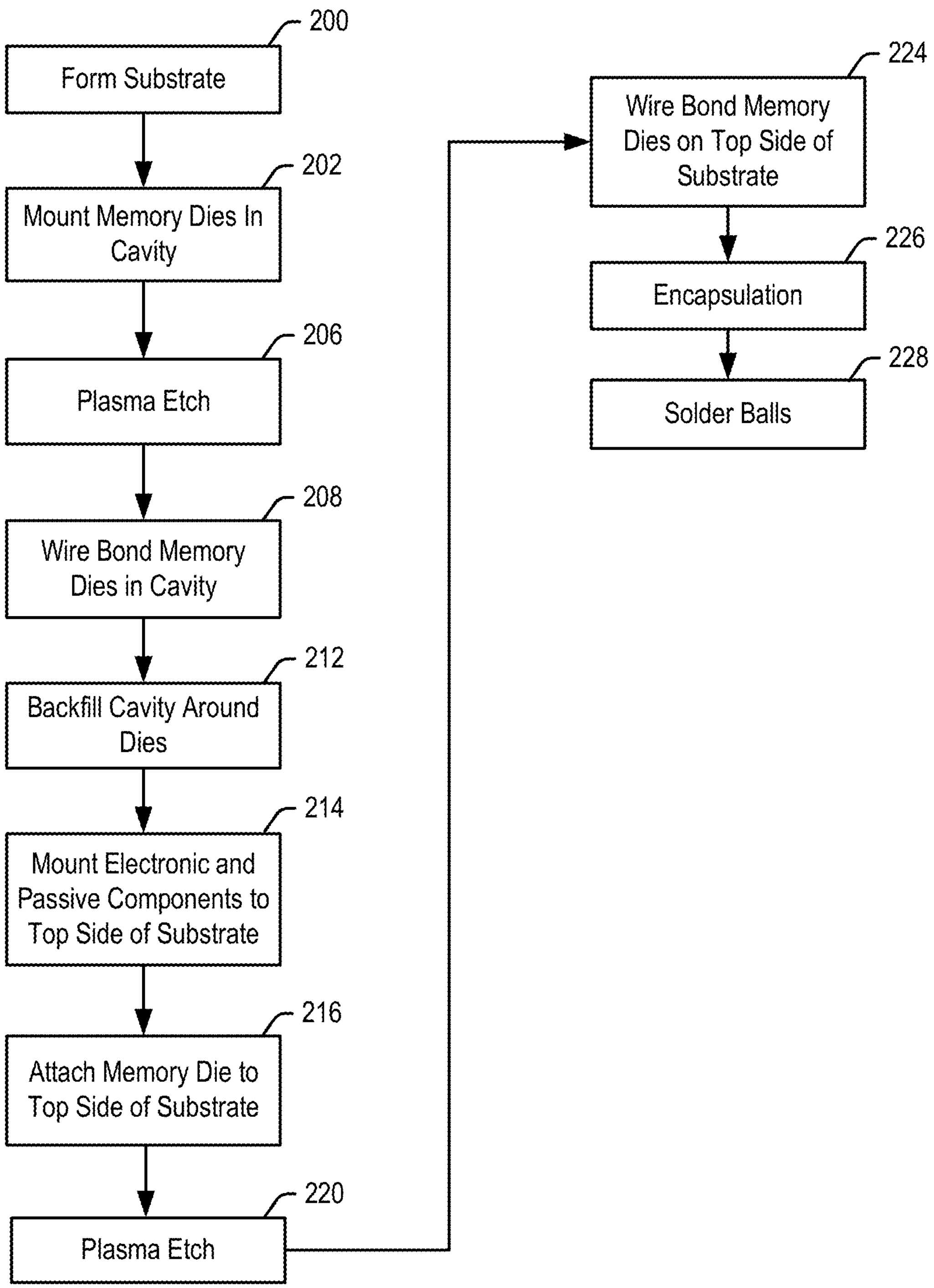
FIG. 1 is a flowchart of the overall assembly process of a semiconductor device according to embodiments of the present technology.

An embodiment of the present technology will now be explained with reference to the flowcharts of FIGS. 1 and 2 and the perspective, side and bottom views of FIGS. 3 through 18. The figures show a single semiconductor device 150, or portions thereof. In embodiments, the semiconductor device 150 may be assembled on an individual substrate, or the semiconductor device 150 may be assembled on a panel of substrates to achieve economies of scale.

In step 200, the substrate 100 is formed. Substrate 100 is a signal-carrier medium provided for transferring electrical signals between semiconductor dies mounted on and in the substrate and a host device, as explained below. In one embodiment of the present technology, the substrate 100 may be a printed circuit board (PCB), including those having edge connectors for connecting to a host device such as a motherboard. In further embodiments, the substrate 100 may be a PCB having solder balls for soldering the substrate 100 to a host device such as a motherboard or other PCB. It is understood that the substrate 100 may be formed of other signal-carrier mediums such as flex tapes, interposers or combinations thereof in further embodiments.

Further detail of the formation of substrate 100 will now be described with reference to the flowchart of FIG. 2 and the views of FIGS. 3 through 9. The substrate may be formed of multiple dielectric cores 102, 104 sandwiched between multiple conductive layers 106, 108, 110. While the figures show two dielectric cores sandwiched between three conductive layers, there may be more or less dielectric cores and/or conductive layers in further embodiments. The dielectric cores 102, 104 may be formed of various dielectric materials such as for example, polyimide laminates, epoxy resins including FR4 and FR5, bismaleimide triazine (BT), and the like. The cores 102, 104 may be ceramic or organic in alternative embodiments. The conductive layers 106, 108, 110 surrounding the cores may be formed of copper or copper alloys, plated copper or plated copper alloys, Alloy 42 (42Fe/58Ni), copper plated steel, or other metals and materials known for use in substrate PCBs.

Figure 3:
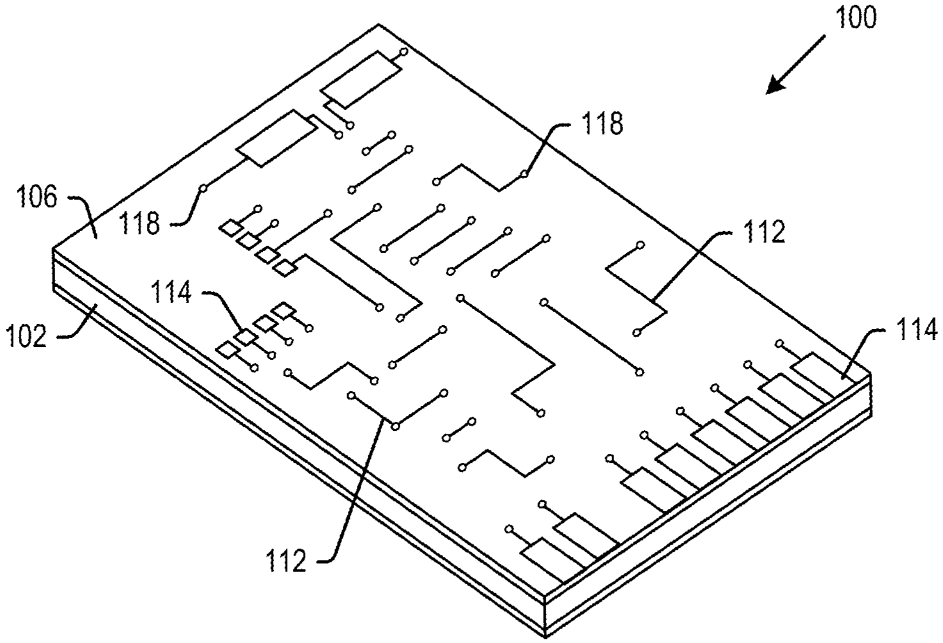
FIG. 3 is a top perspective view of a top portion of the substrate according to embodiments of the present technology.
Figure 4:
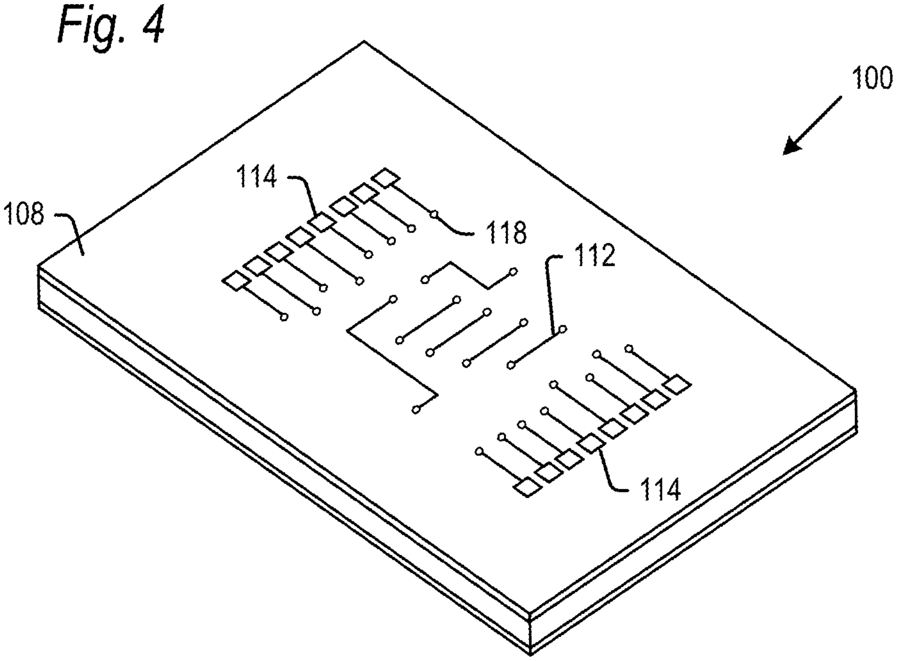
FIG. 4 is a bottom perspective view of a top portion of the substrate according to embodiments of the present technology.

In one embodiment, the substrate 100 may initially be formed by laminating conductive layers onto a dielectric layer in step 230, and then forming a conductance pattern in the conductive layers on one or both sides of the dielectric layer in step 232. FIG. 3 shows a top perspective view of a conductance pattern in layer 106 on a top surface of dielectric core 102, and FIG. 4 shows a bottom perspective view of a conductance pattern in layer 108 on a bottom surface of core 102. The conductance patterns may be defined in the conductive layers 106 and 108 by selective removal of portions the conductive layers. The removal of areas of the conductive layers may be performed for example by a known photolithography etching process. The conductance patterns left behind may include electrical traces 112 and contact pads 114. The traces 112 and contact pads 114 shown in layers 106 and 108 (only some of which are numbered in the figures) are by way of example, and the layers 106, 108 may include more traces and/or contact pads than is shown in the figures, and they may be in different locations than is shown in the figures.

In step 234, if substrate 100 includes more dielectric and conductive layers, steps 230 and 232 are repeated. As shown in the perspective view of FIG. 5, the second dielectric core 104 and third conductive layer 110 may be laminated or otherwise affixed to the surface of conductive layer 108 opposed to that which is affixed to the core 102. The conductive layer 110 may then be etched into a conductance pattern of traces 112 and contact pads 114, as shown for example in the bottom views of substrate 100 shown in FIGS. 7 and 9 described below. The traces 112 and contact pads 114 shown in layer 110 (only some of which are numbered in the figures) are by way of example, and the layer 110 may include more traces and/or contact pads than is shown in the figures, and they may be in different locations than is shown in the figures.

Figure 5:
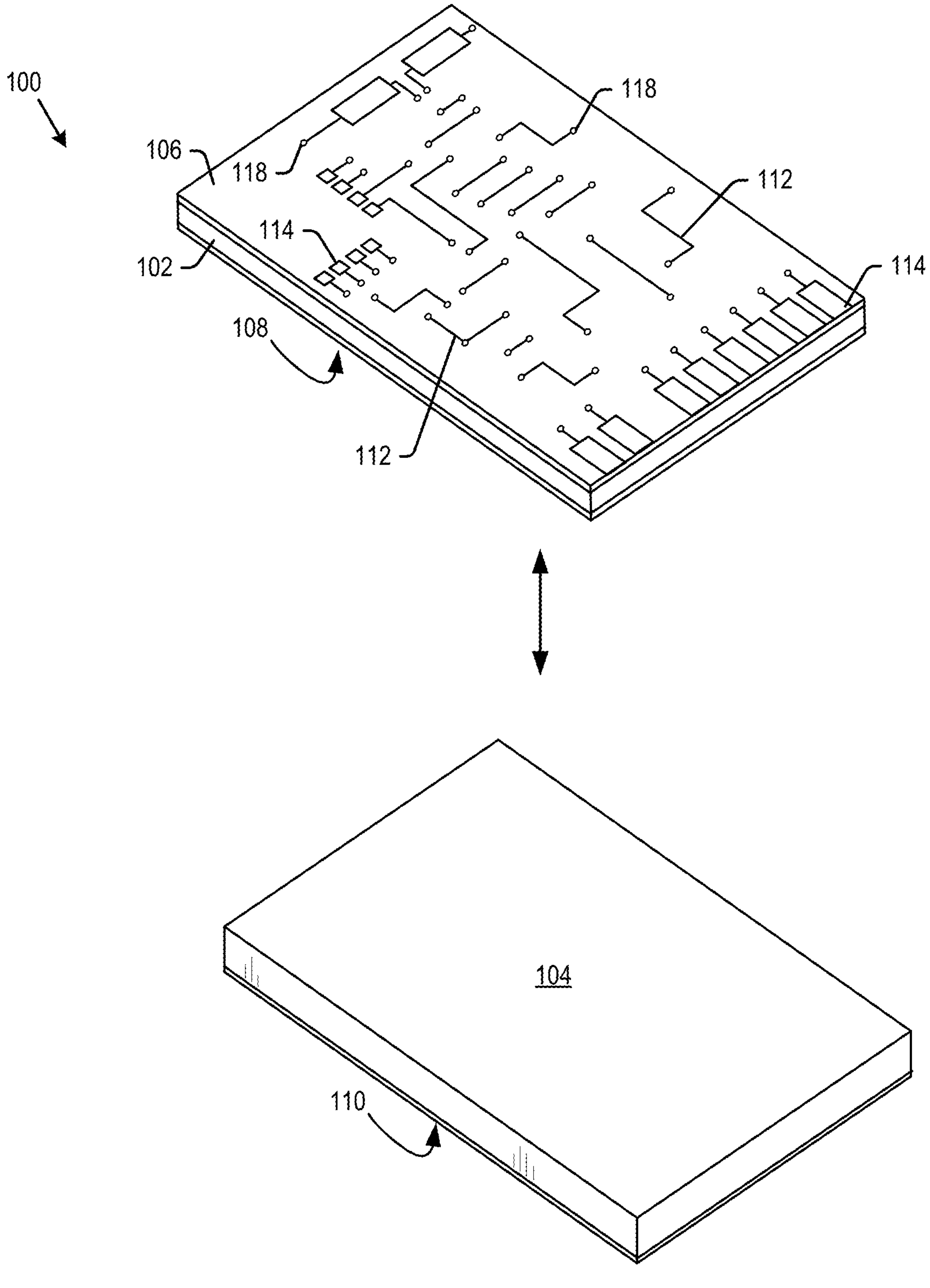
FIG. 5 is a perspective view of top and bottom portions of the substrate for a semiconductor device according to embodiments of the present technology.
Figure 6:
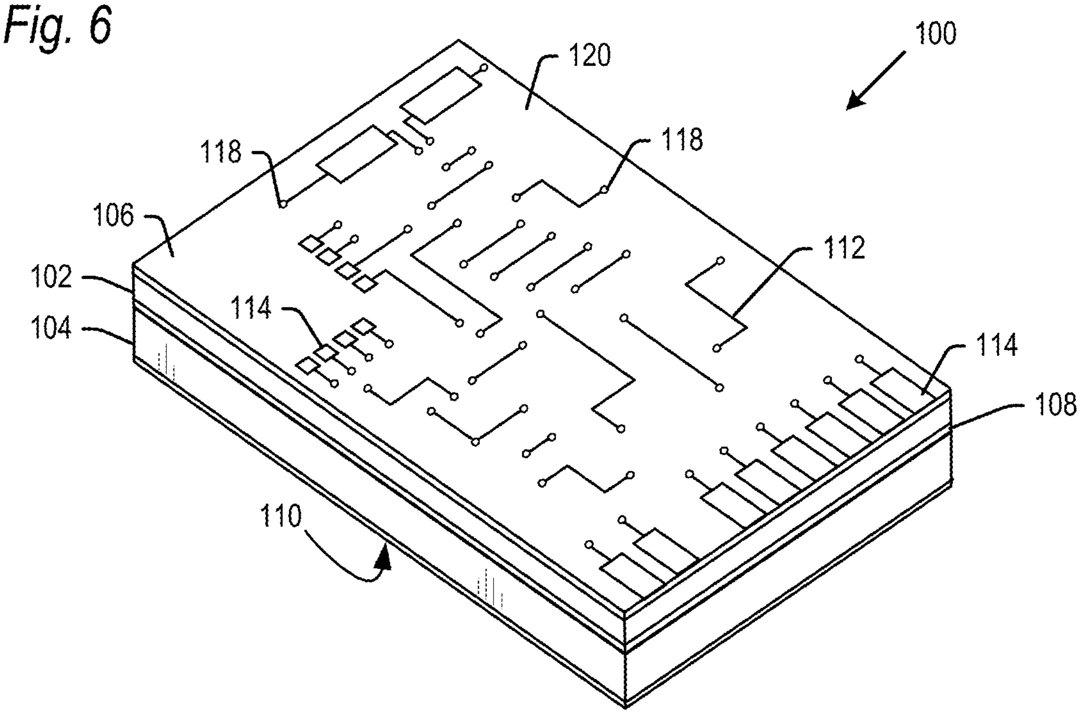
FIG. 6 is a top perspective view of a substrate for a semiconductor device according to embodiments of the present technology.

The assembly order of the different layers of substrate 100 described above is by way of example only, and may vary in further embodiments. For example, FIGS. 3-5 show the conductive layers 106 and 108 initially being affixed to core 102 and thereafter, core 104 is affixed to conductive layer 108. In a further embodiment, conductive layers 108 and 110 may initially be formed on dielectric layer 104 and then etched with their conductance patterns. Subsequently, dielectric core 102 having conductive layer 106 may be affixed thereto.

Figure 7:
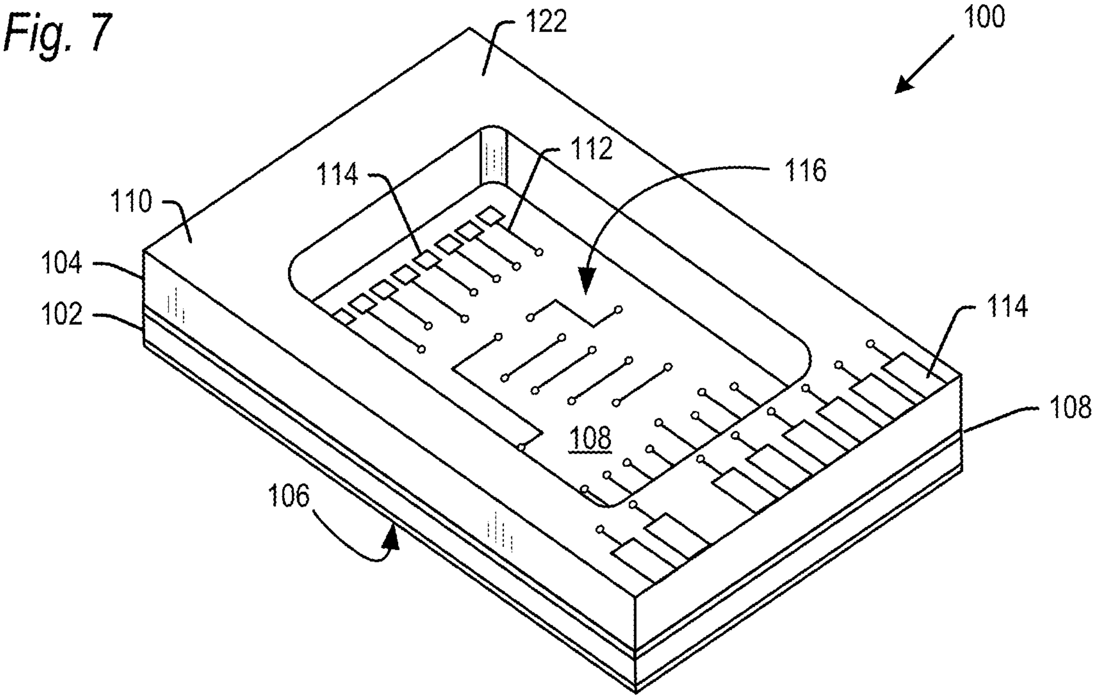
FIG. 7 is a bottom perspective view of a substrate for a semiconductor device according to embodiments of the present technology.
Figure 8:
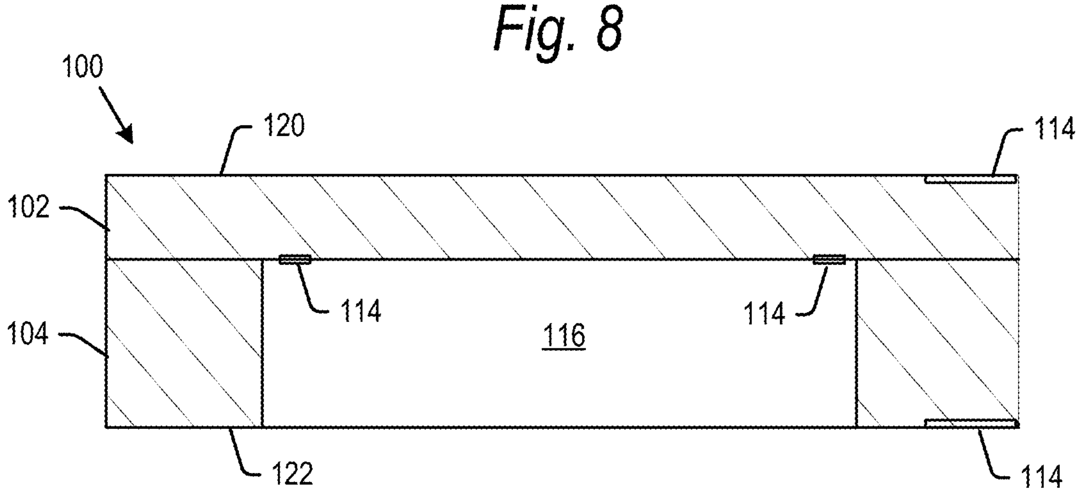
FIG. 8 is a cross-sectional side view of a substrate for a semiconductor device according to embodiments of the present technology.
Figure 9:
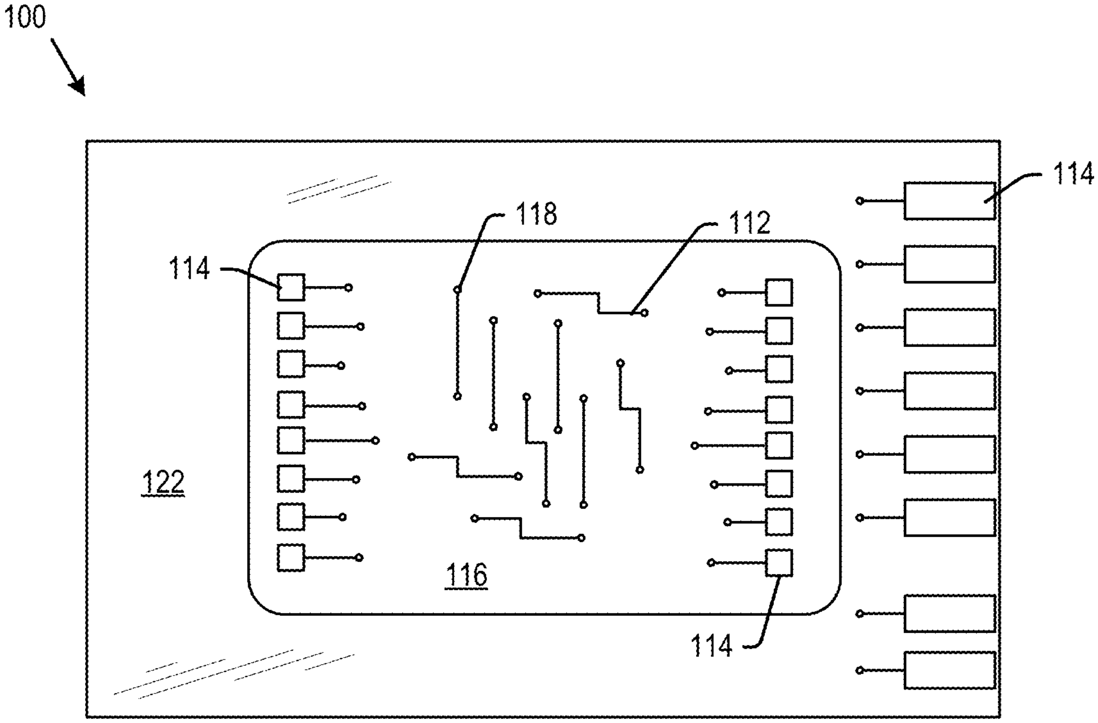
FIG. 9 is a bottom view of a substrate for a semiconductor device according to embodiments of the present technology.
Figure 10:
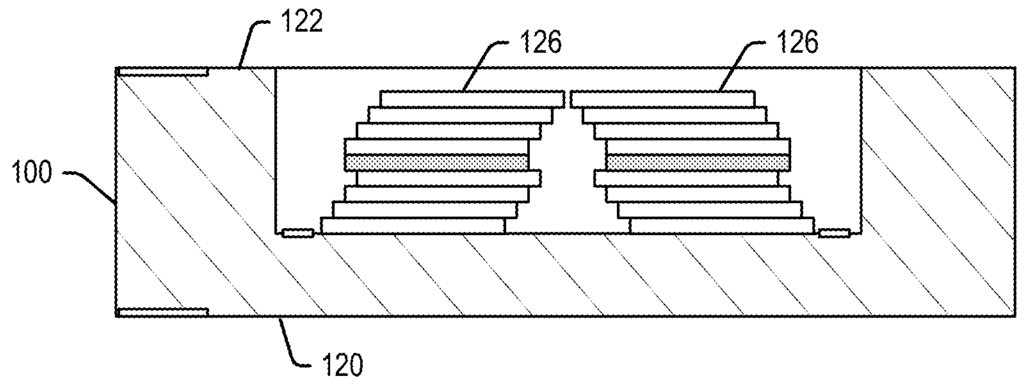
FIG. 10 is a cross-sectional side view of a substrate for a semiconductor device including memory dies in a cavity of the substrate according to embodiments of the present technology.

Once all layers have been added to the substrate 100, a cavity 116 may be formed in step 236 in a bottom surface of the substrate 100. FIGS. 6 through 9 show a top perspective view, a bottom perspective view, a cross-sectional side view and a bottom view, respectively, of the substrate 100 including cavity 116. The substrate 100 may have a top surface 120 including the conductance pattern in the layer 106, and a bottom surface 122 including the conductance pattern in layer 110. The cavity 116 is formed entirely through the conductive layer 110 and the dielectric core 104 to a depth which exposes the conductance pattern in the conductive layer 108. FIGS. 7 and 9 show the conductance pattern of traces 112 and contact pads 114 in the conductive layer 110 on bottom surface 122, and the conductance pattern of traces 112 and contact pads 114 in the conductive layer 108 exposed within cavity 116.

The cavity 116 may be formed by any of a wide variety of methods, including with a controlled depth routing process or through a controlled depth laser process. Alternatively or additionally, the conductance pattern in layer 108 may be exposed in cavity 116 using photolithographic and/or etching processes, including for example a plasma etch cleaning of the contact pads 114 in layer 108 after formation of the cavity 116.

In step 238, the substrate 100 may be drilled to define through-hole vias 118 in the substrate 100 which allow signal transmission between the different conductive layers 106, 108, 110 of the substrate 100. The vias 118 (only some of which are numbered in the figures) shown are by way of example, and the substrate may include many more vias 118 than is shown in the figures, and they may be in different locations than is shown in the figures. The vias 118 may alternatively be formed earlier in the process, for example before the conductive and dielectric layers are affixed to each other and/or before the cavity 116 is formed.

In embodiments, the finished substrate 100 may have a length of 30.0 mm, a width of 22.0 mm and a depth of 0.8 mm. In such embodiments, the cavity may have a length (corresponding to the length dimension of the substrate) of 17.6 mm, a width (corresponding to the width dimension of the substrate) of 12.4 mm and a depth of 0.47 mm. It is understood that the dimensions of both the substrate 100 and the cavity 116 may vary in further embodiments, proportionally or disproportionally to each other. For example, the depth of the cavity 116 is disclosed as being slightly more than half of the overall thickness of the substrate 100. In further embodiments, the depth of the cavity 116 may in general be 30% to 90% of the overall thickness of the substrate 100, and more particularly 50% to 75% of the overall thickness of the substrate 100. The depth of the cavity 116 may be outside of these ranges in further embodiments.

A solder mask may be applied to the substrate in step 240, leaving the contact pads 114 exposed through openings in the solder mask. After the solder mask is applied, the contact pads 114 and any other solder areas on the conductance patterns may be plated with Ni/Au, immersion gold or the like in step 244 in a known electroplating or thin film deposition process. The substrate 100 may then be inspected and operationally tested in step 248. These inspections may for example include an automatic optical inspection (AOI), an automated visual inspection (AVI) and/or a final visual inspection (FVI) to check for defects, contamination, scratches and discoloration. One or more of these steps may be omitted or performed in a different order in further embodiments.

Figure 2:
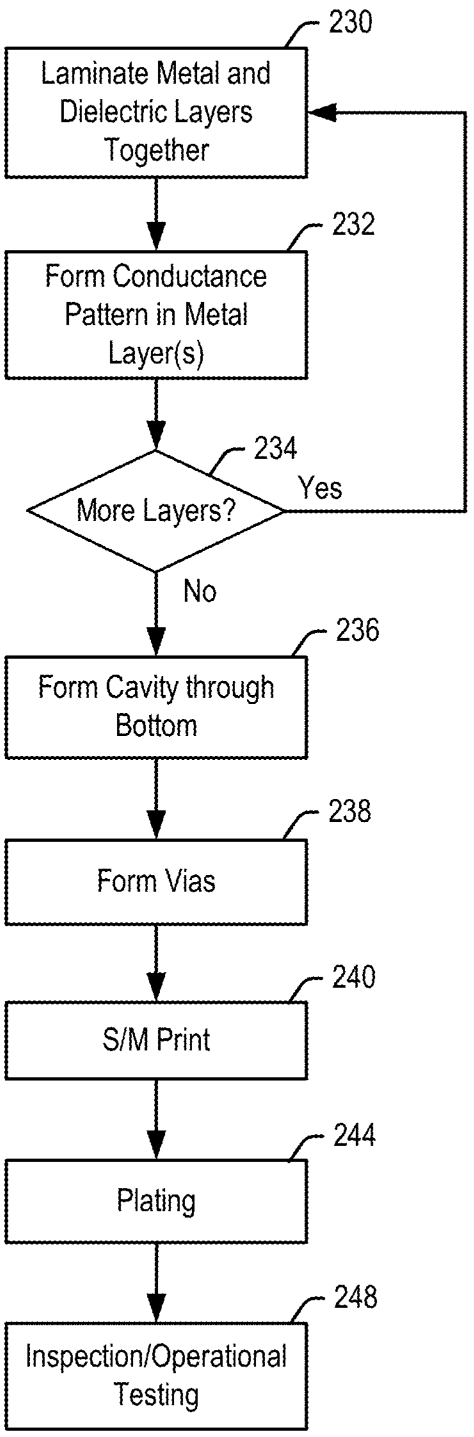
FIG. 2 is a flowchart showing additional detail of step 200 of FIG. 1 according to embodiments of the present technology.

The order of the steps set forth in the flowchart of FIG. 2 is by way of example only, and the order may be varied in further embodiments. For example, in an alternative embodiment, the cavity 116 may be formed through conductive layer 110 and core 104 before those layers are assembled together with the remaining layers.

Referring again to FIG. 1, in step 202, one or more memory dies may be mounted within cavity 116. With the top surface 120 supported on a chuck or work surface, one or more memory dies 126 may be stacked within cavity 116 as shown in the cross-sectional side view of FIG. 10. The memory dies 126 may for example be 2D NAND flash memory or 3D BiCS (Bit Cost Scaling), V-NAND or other 3D flash memory, but other types of memory dies 126 may be used. These other types of memory dies include but are not limited to RAM such as an SDRAM, DDR SDRAM, LPDDR and GDDR.

In the illustrated embodiment, there are two stacks of memory dies 126, each stack including eight dies 126. There may be a single stack of dies in further embodiments. The memory dies 126 may be stacked atop each other stepped offset configuration. The number of dies 126 shown in each stack is by way of example only, and embodiments may include different numbers of semiconductor dies in cavity 116, including for example 1, 2, 4, 8, 16, 32 or 64 dies. There may be other numbers of dies in further embodiments, with the understanding that the dies fit within the cavity 116 (not protrude beyond surface 122). The dies may be affixed to the substrate and/or each other in cavity 116 using a die attach film. As one example, the die attach film may be cured to a B-stage to preliminarily affix the dies 126 in the stack, and subsequently cured to a final C-stage to permanently affix the dies 126 to the substrate 100.

Figure 11:
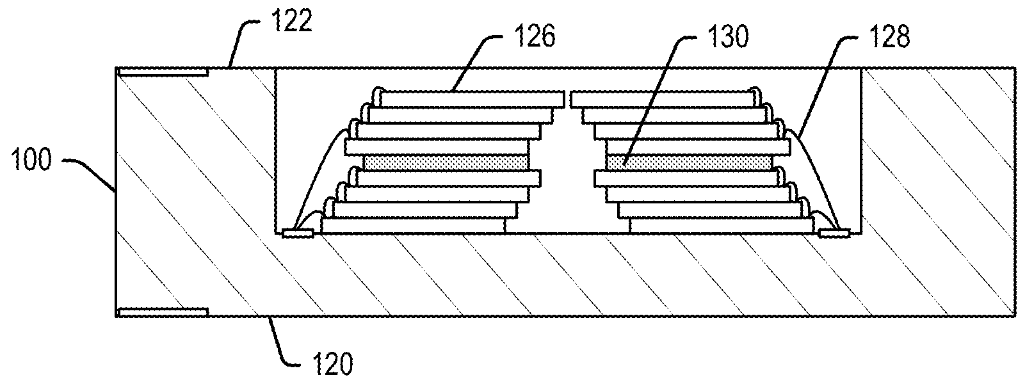
FIG. 11 is a cross-sectional side view of a substrate for a semiconductor device including memory dies wire bonded in a cavity of the substrate according to embodiments of the present technology.

In step 206, the pads 114 within cavity 116 may be cleaned in a plasma etch process. In step 208, the memory dies 126 in cavity 116 may be electrically interconnected to each other and to the contact pads 114 with bond wires 128 as shown in FIG. 11. FIG. 11 shows each stack having a first group of dies bonded to each other and the substrate 100, and a second group of dies bonded to each other and the substrate. The first and second groups in each stack may be separated by a wire embed film (WEF) 130. WEF 130 may be omitted in further embodiments, and each stack may only include a single group of dies, each bonded to each other and then the substrate. The bonds for wires 128 may be formed by a ball-bonding technique, but other wire bonding techniques are possible.

Figure 12:
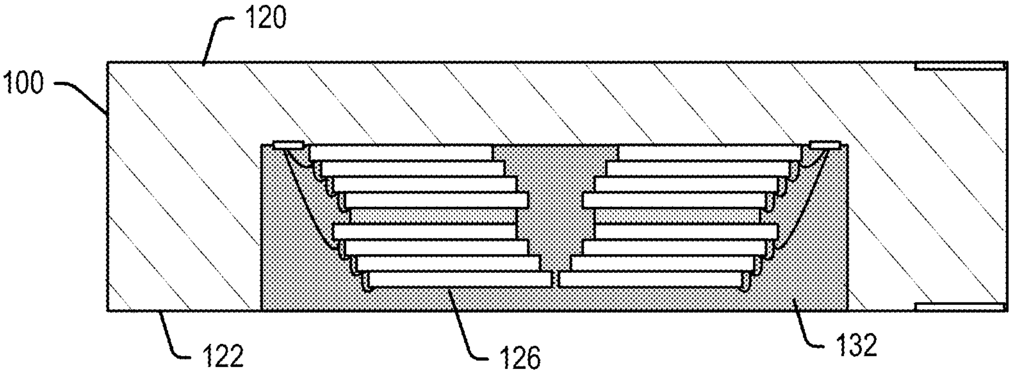
FIG. 12 is a cross-sectional side view of a substrate for a semiconductor device including memory dies in a backfilled cavity of the substrate according to embodiments of the present technology.
Figure 13:
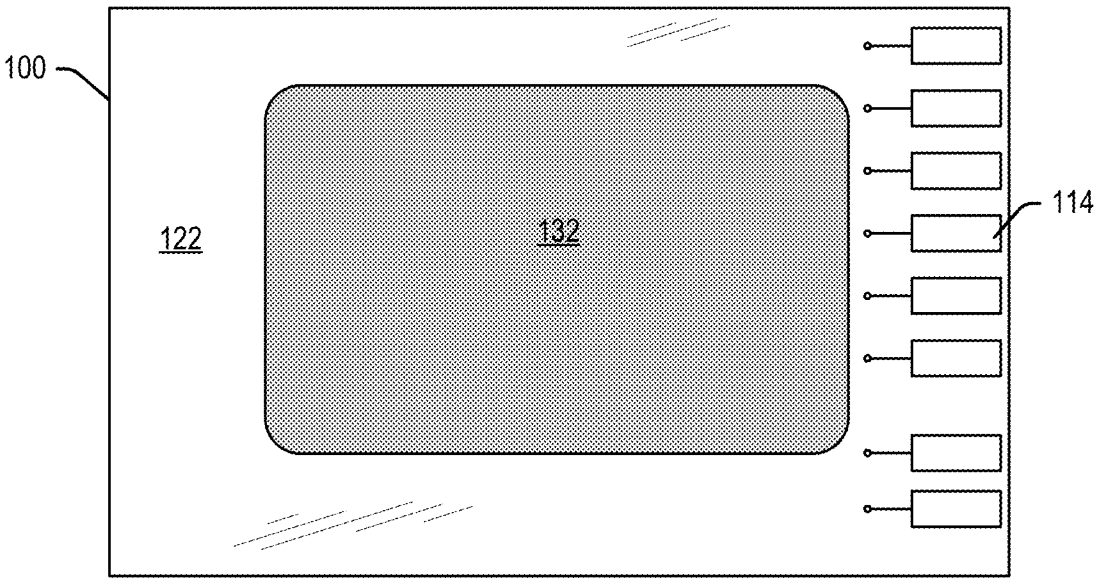
FIG. 13 is a bottom view of a substrate for a semiconductor device including memory dies in a backfilled cavity of the substrate according to embodiments of the present technology.

In step 212, a sealing compound 132 may fill the cavity 116 around the memory dies 126 and bond wires 128 as shown in the cross-sectional side view of FIG. 12 and the bottom view of FIG. 13. Sealing compound 132 may for example be an epoxy resin, Phenol resin, fused silica, crystalline silica, carbon black and/or metal hydroxide. Such sealing compounds are available for example from Sumitomo Corp. and Nitto-Denko Corp., both having headquarters in Japan. Other sealing compounds from other manufacturers are contemplated. Once the sealing compound 132 is hardened, the substrate 100 may be flipped over so that surface 120 is again facing upward. In embodiments, the sealing compound 132 may have a coefficient of thermal expansion approximating that of the substrate 100 so that the sealing compound does not stress the substrate upon heating or cooling of the substrate.

Figure 14:
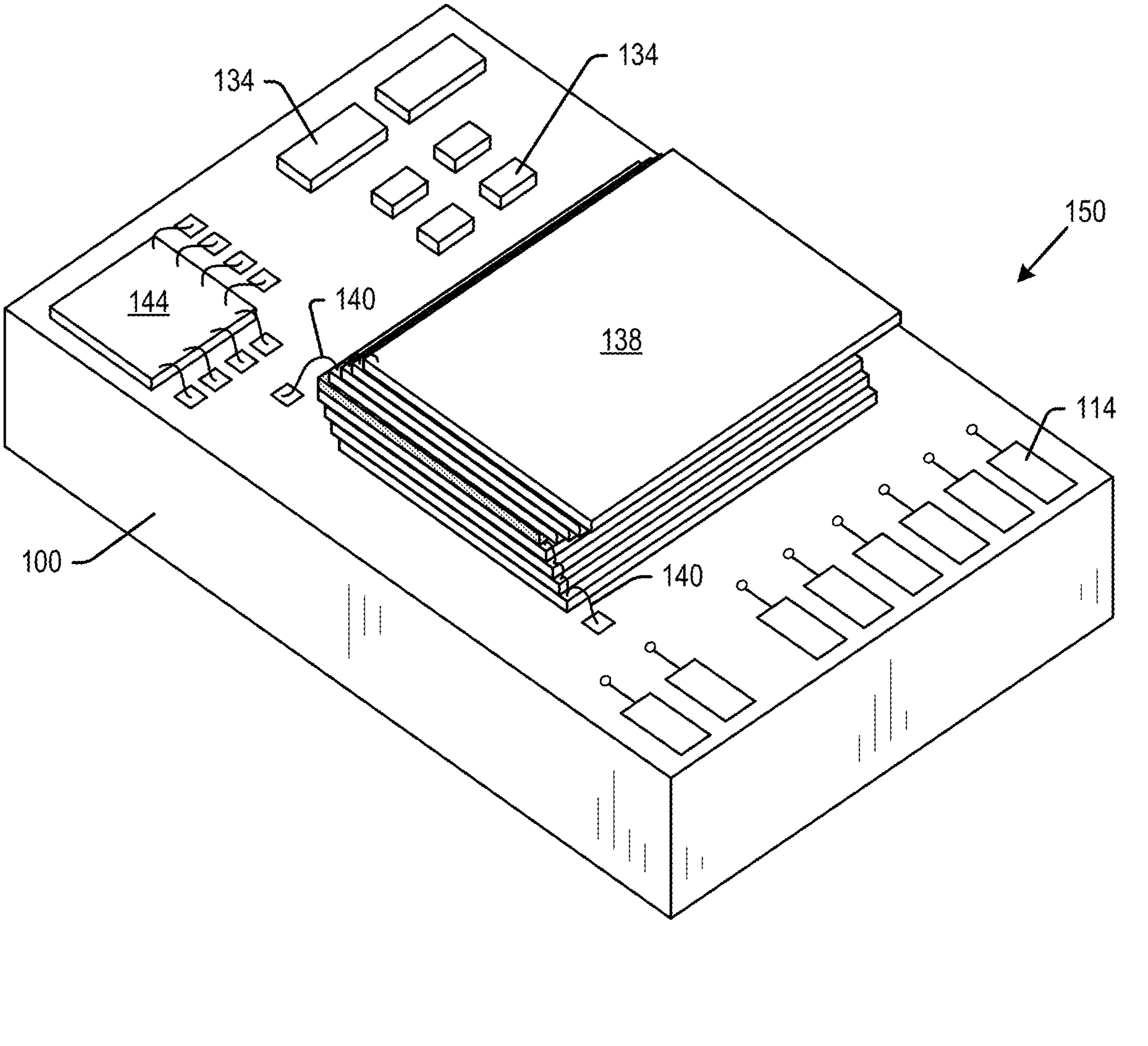
FIG. 14 is a perspective view of a semiconductor device according to embodiments of the present technology including memory dies mounted on top of the substrate.

With the bottom surface 122 supported on a chuck or other work surface, passive and/or electronic components 134 may next be affixed to the top surface 120 of substrate 100 in a step 214 and as shown in the perspective view of FIG. 14. The one or more passive components may include for example one or more capacitors, resistors and/or inductors, though other components are contemplated. The electronic components may for example comprise various integrated circuit devices. The passive and/or electronic components 134 shown are by way of example only, and the number, type and position may vary in further embodiments.

Figure 15:
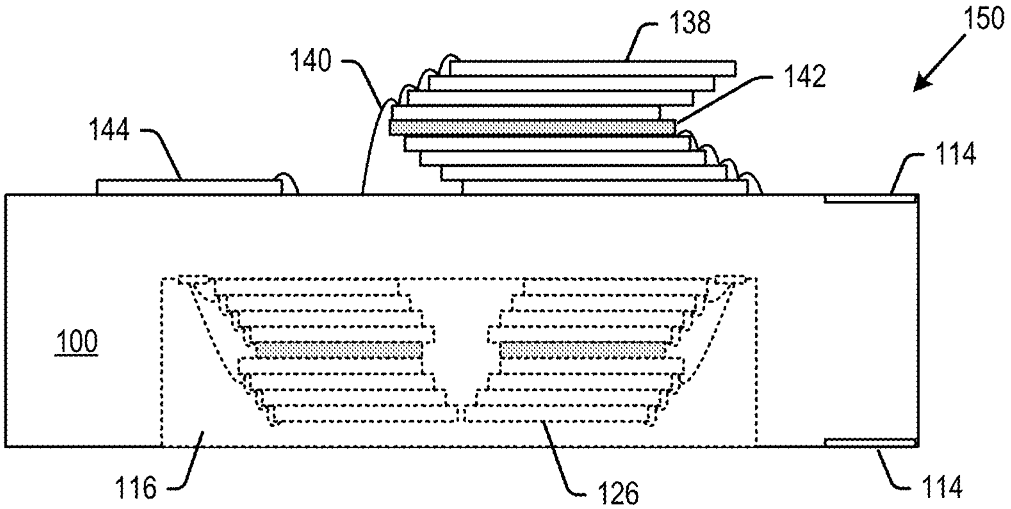
FIG. 15 is a side view of a semiconductor device according to embodiments of the present technology including memory dies mounted on top of the substrate.

In step 216, one or more semiconductor dies 138 may be mounted on the top surface 120 of the substrate 100 as shown in the perspective view of FIG. 14 and the side view of FIG. 15. The semiconductor dies 138 may for example be one or more memory dies such as 2D NAND flash memory or 3D BiCS (Bit Cost Scaling), V-NAND or other 3D flash memory, but other types of dies 138 may be used. These other types of semiconductor dies include but are not limited to RAM such as an SDRAM, DDR SDRAM, LPDDR and GDDR.

Where multiple semiconductor dies 138 are included, the semiconductor dies 138 may be stacked atop each other in an offset stepped configuration to form a die stack as shown in FIGS. 14 and 15. The number of dies 138 shown in the stack is by way of example only, and embodiments may include different numbers of semiconductor dies, including for example 1, 2, 4, 8, 16, 32 or 64 dies. There may be other numbers of dies in further embodiments.

The dies may be affixed to the substrate and/or each other using a die attach film. As noted above with respect to dies 126, the die attach film may be cured to a B-stage to preliminarily affix the dies 138 in the stack, and subsequently cured to a final C-stage to permanently affix the dies 138 to the substrate 100. This final curing process for dies 138 may be the same final curing process as for dies 126 or it may be different.

In step 220, the bond pads 114 on the top surface 120 may be cleaned in a plasma etch. Next in step 224, the memory dies 138 on top surface 120 may be electrically interconnected to each other and to the contact pads 114 on the top surface 120 with bond wires 140 as shown in FIGS. 14 and 15. FIG. 14 shows only the bond wires 140 from the first die bond pads on each die 138 for simplicity electrically coupling the first die bond pads to each other and the substrate 100. However, the bond wires 140 may be provided that connect each of the die bond pads on dies 138 to each other and the substrate along the edge of each die 138. The bonds for wires 140 may be formed by a ball-bonding technique, but other wire bonding techniques are possible. The memory dies 138 may be electrically interconnected to each other and the substrate 100 by other methods in further embodiments, including by through-silicon vias (TSVs) and flip-chip technologies.

FIGS. 14 and 15 show a stack having a first group of dies bonded to each other and the substrate 100, and a second group of dies bonded to each other and the substrate. The first and second groups may be separated by WEF 142. WEF 142 may be omitted in further embodiments, and the stack may include a single group of dies, each bonded to each other and then the substrate.

FIGS. 14 and 15 also show a semiconductor die 144 which may for example be a controller die mounted to the substrate 100. Controller die 144 may for example be an ASIC for controlling transfer of signals and data to and from the memory dies 126 and 138. The controller die 144 may be wire bonded to contact pads 114 of the substrate as shown, or it may be flip-chip mounted in further embodiments.

In one example where substrate 100 is used as an edge connector PCB to mount directly to a host device such as a motherboard, the semiconductor device 150 shown in FIGS. 14 and 15 may be complete. The contact pads 114 on the top and bottom surfaces 120, 122 may be used to affix the semiconductor device 150 to an edge connector on the host device to enable the exchange of data between the host device and the semiconductor dies 126 and/or 138.

Figure 16:
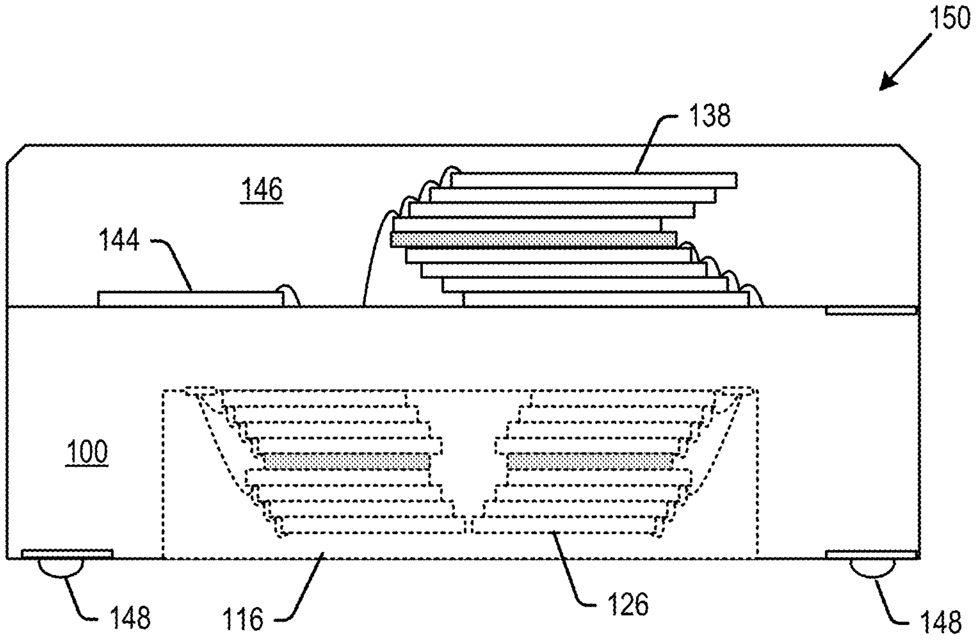
FIG. 16 is a side view of a semiconductor device according to embodiments of the present technology encapsulated in molding compound and including solder balls.

In a further embodiment shown in FIG. 16, the semiconductor device 150 may be a ball grid array (BGA) package. In such embodiments, the components on the top surface 120 may be encapsulated in a mold compound 146. Mold compound 146 may include for example solid epoxy resin, Phenol resin, fused silica, crystalline silica, carbon black and/or metal hydroxide. Other mold compounds are contemplated. The mold compound may be applied by various known processes, including by FFT (flow free thin) molding, compression molding, transfer molding or injection molding techniques. This embodiment may further include solder balls 148 affixed to contact pads 114 on the bottom surface 122 of the substrate 100. The solder balls 148 may be used to affix the semiconductor device 150 to a host device such as a motherboard or other PCB.

In the embodiment described above and shown for example in FIGS. 12 and 13, a sealing compound is used to fill cavity 116. In embodiments where the mold compound is applied as shown in FIG. 16, the mold compound may be sealing compound within the cavity 116. In such embodiments, the semiconductor device may be placed in a mold chase, and the mold compound may be injected to cover the top surface 120 as shown in FIG. 16, and to fill the cavity 116 as shown in FIG. 12, at the same time.

In a further embodiment, the molding compound 146 may cover the components on the top side of the substrate, and the contact pads 114 on the bottom surface 122 are left exposed. Such contact pads 114 may be configured as contact fingers so that the semiconductor device 150 is used as a land grid array (LGA) package or memory card. In such an embodiment, the semiconductor device 150 may be removably inserted into a slot of a host device so that the contact pads/fingers 114 on the bottom surface 122 mate with pins in the host device slot to enable the exchange of data between the host device and dies 126 and/or dies 138.

Figure 17:
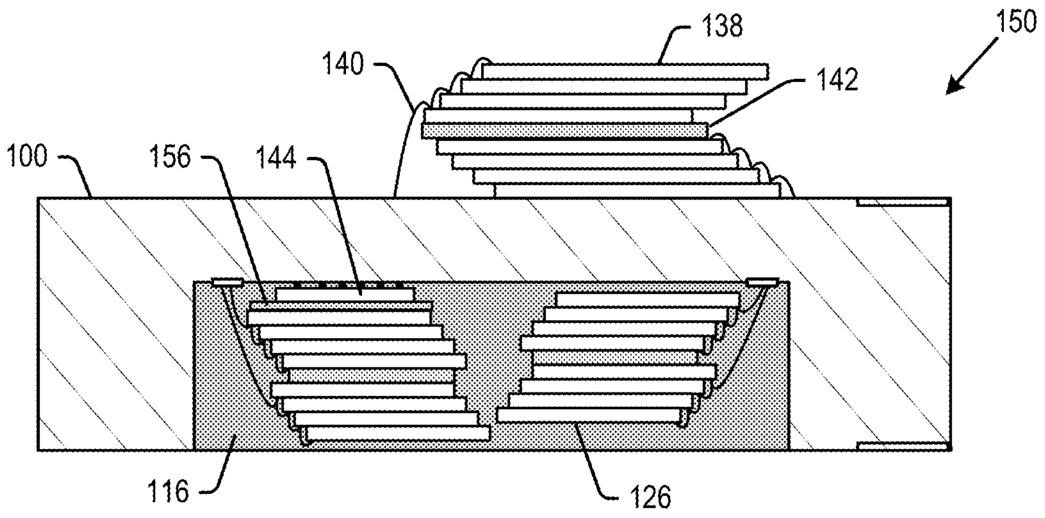
FIG. 17 is a side view of a semiconductor device according to an alternative embodiment of the present technology where a controller die is mounted with the memory dies in the cavity.
Figure 18:
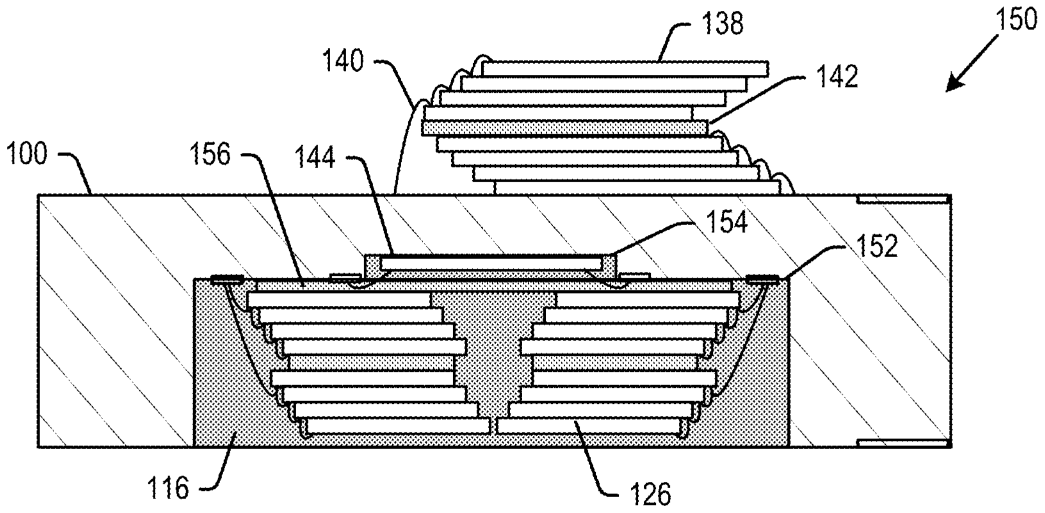
FIG. 18 is a side view of a semiconductor device according to a further alternative embodiment of the present technology where a controller die is mounted with the memory dies in the cavity.

In the embodiments described above, the controller die 144 is mounted to the top surface 120. However, in an alternative embodiment, the controller die 144 may be mounted within the cavity 116. Examples of such embodiments are shown in FIGS. 17 and 18. In FIG. 17, the controller die 144 may be flip-chip mounted to contact pads in the substrate 100 at the bottom of the cavity (directly adjacent to the conductive layer 108), and a spacer 156 may be provided on top, next to or around the controller die, so that one or both of the memory die stacks may be built on the controller and/or spacer, extending toward the bottom surface 122. In a further embodiment shown in FIG. 18, the cavity 116 may have a second, smaller but deeper cavity so that the cavity 116 has two levels: level 152 and a deeper level 154. The controller die 144 may be mounted within the deeper level 154 of the cavity and the die stack may be mounted in the first level 152 of the cavity. Here, a WEF 156 may be provided to enable wire bonding of the controller die to contact pads 114 in the conductive layer 108, and to provide a support layer on which the memory dies 126 may be stacked. The controller 144 may be flip-chip mounted to contact pads on surface of the substrate 100 in the deeper level 154. In such an embodiment, the memory dies 126 may simply be stacked without the WEF 156 on a bottom of the level 152.

The semiconductor device 150 including memory dies 126 in cavity 116 provides increased storage capacity (e.g., twice as much) as conventional semiconductor packages of the same footprint and size. In one example, the semiconductor device may have a storage capacity of 4 Terabytes. Semiconductor dies are currently fabricated as thin as 31 microns, and will get thinner with further technological innovations. Thus, large numbers of such dies may be stacked within the cavity 116, as well as on the top surface of the substrate, to further improve the storage capacity of device 150. Moreover, in further embodiments, the depth of the cavity 116 may be increased without increasing the overall thickness of the substrate to allow even more memory dies 126 to be stacked within the cavity 116.

In the embodiments described above, the semiconductor dies 126 in cavity 116, and the semiconductor dies 138 on the surface 120 are memory dies. However, it is understood that the semiconductor dies within the cavity 116 and/or the semiconductor dies on surface 120 may be other types of semiconductor dies in further embodiments.

In summary, in one example, the present technology relates to a semiconductor device, comprising: a signal carrier medium including first and second opposed surfaces; a first group of contact pads on the first surface of the signal carrier medium; a cavity formed in the second surface of the signal carrier medium; a second group of contact pads within the cavity; a first group of one or more semiconductor dies mounted on the first surface of the signal carrier medium and electrically coupled to the first group of contact pads on the first surface of the signal carrier medium; and a second group of one or more semiconductor dies mounted in the cavity and electrically coupled to the second group of contact pads within the cavity.

In another example, the present technology relates to a semiconductor device, comprising: a signal carrier medium including first and second opposed surfaces; a first conductive layer on the first surface comprising a first set of traces and contact pads; a second conductive layer between the first and second surfaces comprising a second set of traces and contact pads; a third conductive layer on the second surface comprising a third set of traces and contact pads; a cavity formed in the second surface of the signal carrier medium to a depth exposing the second conductive layer; a first plurality of memory dies mounted on the first surface of the signal carrier medium and physically coupled to the contact pads of the first set of traces and contact pads; and a second plurality of memory dies mounted in the cavity and physically coupled to the contact pads of the second set of traces and contact pads.

In a further example, the present technology relates to a semiconductor device, comprising: a signal carrier means including first and second opposed surfaces; a first conductive layer on the first surface comprising a first set of traces and contact pads; a second conductive layer between the first and second surfaces comprising a second set of traces and contact pads; a third conductive layer on the second surface comprising a third set of traces and contact pads; means for exposing the contact pads of the second set of traces and contact pads to enable wire bonding to the contact pads of the second set of traces and contact pads; a first plurality of memory dies mounted on the first surface of the signal carrier medium and wire bonded to the contact pads of the first set of traces and contact pads; and a second plurality of memory dies mounted in the cavity and wire bonded to the contact pads of the second set of traces and contact pads.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:

a signal carrier medium;

a first group of contact pads on a first surface of the signal carrier medium;

a cavity formed in the signal carrier medium, second surface of the signal carrier medium being defined within the cavity, the second surface opposing the first surface;

a second group of contact pads on the second surface within the cavity;

a first group of one or more semiconductor dies mounted on the first surface of the signal carrier medium and electrically coupled to the first group of contact pads on the first surface of the signal carrier medium; and a second group of semiconductor dies mounted in the cavity next to and spaced from the second group of contact pads, the second group of semiconductor dies electrically coupled to the second group of contact pads within the cavity, the second group of semiconductor dies comprising two or more memory dies stacked on each other.

2. The semiconductor device of claim 1, wherein the first group of one or more semiconductor dies comprise one or more memory dies.

3. The semiconductor device of claim 1, wherein the two or more memory dies are stacked on each other with a stepped offset.

4. The semiconductor device of claim 1, further comprising a first set of bond wires configured to electrically couple the first set of one or more semiconductor dies to the first group of contact pads on the first surface of the signal carrier medium.

5. The semiconductor device of claim 4, further comprising a second set of bond wires configured to electrically couple the second group of semiconductor dies to the second group of contact pads within the cavity.

6. The semiconductor device of claim 1, wherein the signal carrier medium has an overall thickness, and the cavity has a depth that is 30% to 90% of the overall thickness of the signal carrier medium.

7. The semiconductor device of claim 1, wherein the signal carrier medium has an overall thickness, and the cavity has a depth that is 50% to 75% of the overall thickness of the signal carrier medium.

8. The semiconductor device of claim 1, wherein the two or more memory dies comprise a plurality of memory dies stacked in two separate stacks within the cavity.

9. The semiconductor device of claim 1, further comprising a compound encapsulating the first group of one or more semiconductor dies on the first surface of the signal carrier medium.

10. The semiconductor device of claim 9, wherein the compound comprises a first compound, the semiconductor device further comprising a second compound filling the cavity and encapsulating the second group of semiconductor dies in the cavity.

11. A semiconductor device, comprising:

a signal carrier medium;

a first group of contact pads on a first surface of the signal carrier medium;

a cavity formed in the signal carrier medium, a second surface of the signal carrier medium being defined within the cavity, the second surface opposing the first surface;

a second group of contact pads on the second surface within the cavity;

a first group of one or more semiconductor dies mounted on the first surface of the signal carrier medium and electrically coupled to the first group of contact pads on the first surface of the signal carrier medium; and a second group of semiconductor dies mounted in the cavity next to and spaced from the second group of contact pads and wire bonded to the second group of contact pads within the cavity, the second group of semiconductor dies comprising two or more memory dies stacked on each other.

12. The semiconductor device of claim 11, wherein the first group of one or more semiconductor dies comprise one or more memory dies.

13. The semiconductor device of claim 11, wherein the two or more memory dies are stacked on each other with a stepped offset.

14. The semiconductor device of claim 11, wherein the signal carrier medium has an overall thickness, and the cavity has a depth that is 30% to 90% of the overall thickness of the signal carrier medium.

15. The semiconductor device of claim 11, wherein the signal carrier medium has an overall thickness, and the cavity has a depth that is 50% to 75% of the overall thickness of the signal carrier medium.

16. The semiconductor device of claim 11, wherein the two or more memory dies comprise a plurality of memory dies stacked in two separate stacks within the cavity.

17. The semiconductor device of claim 11, further comprising a compound encapsulating the first group of one or more semiconductor dies on the first surface of the signal carrier medium.

18. The semiconductor device of claim 17, wherein the compound comprises a first compound, the semiconductor device further comprising a second compound filling the cavity and encapsulating the second group of semiconductor dies in the cavity.

19. A semiconductor device, comprising:

a signal carrier medium;

a first group of contact pads on a first surface of the signal carrier medium;

a cavity formed in the signal carrier medium, second surface of the signal carrier medium being defined within the cavity, the second surface opposing the first surface;

a second group of contact pads on the second surface within the cavity;

a first group of one or more semiconductor dies mounted on the first surface of the signal carrier medium and electrically coupled to the first group of contact pads on the first surface of the signal carrier medium; and a second group of semiconductor dies mounted in the cavity next to the second group of contact pads and wire bonded to the second group of contact pads within the cavity, the second group of semiconductor dies comprising two or more memory dies stacked on each other.

* * * * *